United States Patent [19]

Oster et al.

[11] Patent Number: 5,793,218
[45] Date of Patent: Aug. 11, 1998

[54] GENERIC INTERFACE TEST ADAPTER

[75] Inventors: Melvin G. Oster, Newbury Park; Brian K. Fuchs, Chatsworth; Kenneth Reid, Marina del Rey, all of Calif.

[73] Assignee: Lear Astronics Corporation, Santa Monica, Calif.

[21] Appl. No.: 573,026

[22] Filed: Dec. 15, 1995

[51] Int. Cl.$^6$ .................................................. G01R 31/02
[52] U.S. Cl. ......................................... 324/754; 324/761
[58] Field of Search ................................. 324/754, 755, 324/758, 761, 158.1

[56] References Cited

U.S. PATENT DOCUMENTS

| | | | |
|---|---|---|---|
| 3,654,585 | 4/1972 | Wickersham | 324/761 |
| 3,751,649 | 8/1973 | Hart, Jr. | 235/153 AC |
| 3,854,125 | 12/1974 | Ehling et al. | 340/172.5 |
| 4,138,643 | 2/1979 | Beck | 324/754 |
| 4,352,061 | 9/1982 | Matrone | 324/754 |
| 4,354,268 | 10/1982 | Michel et al. | 371/20 |
| 4,402,055 | 8/1983 | Lloyd et al. | 364/579 |
| 4,417,204 | 11/1983 | Dehmel et al. | 324/537 |
| 4,488,299 | 12/1984 | Fellhauer et al. | 371/20 |
| 4,551,675 | 11/1985 | Heys et al. | 324/754 |
| 4,590,581 | 5/1986 | Widdoes, Jr. | 364/578 |
| 4,716,500 | 12/1987 | Payne | 361/398 |
| 4,718,064 | 1/1988 | Edwards et al. | 371/20 |
| 4,724,383 | 2/1988 | Hart | 324/754 |
| 4,810,958 | 3/1989 | Mogi et al. | 324/73 R |
| 4,833,402 | 5/1989 | Boegh-Petersen | 324/754 |
| 4,899,306 | 2/1990 | Greer | 364/900 |
| 4,901,259 | 2/1990 | Watkins | 364/578 |
| 5,036,479 | 7/1991 | Prednis et al. | 364/580 |
| 5,058,110 | 10/1991 | Beach et al. | 370/85.6 |
| 5,103,378 | 4/1992 | Stowers et al. | 361/802 |
| 5,136,590 | 8/1992 | Polstra et al. | 371/16.2 |
| 5,175,493 | 12/1992 | Langgard | 324/761 |
| 5,196,789 | 3/1993 | Golden et al. | 324/761 |
| 5,218,302 | 6/1993 | Loewe et al. | 324/380 |
| 5,223,788 | 6/1993 | Andreano et al. | 324/158 R |
| 5,291,129 | 3/1994 | Kazama | 324/757 |
| 5,357,519 | 10/1994 | Martin et al. | 371/15.1 |
| 5,406,199 | 4/1995 | Shah | 324/158.1 |

FOREIGN PATENT DOCUMENTS

| | | |
|---|---|---|
| 0 115 135 | 8/1984 | European Pat. Off. . |
| 0 463 684 A1 | 1/1992 | European Pat. Off. . |

OTHER PUBLICATIONS

Peter Pointl; Interfacing, Often A Performance Bottleneck Between Ate And Device Under Test; Apr. 12, 1989; pp. 94 and 99.

TRW, "Universal Interconnect Device (ICD) for Integrated Family of Test Equipment (FTE)," brochure, 1995, (month available).

*Primary Examiner*—Ernest F. Karlsen
*Attorney, Agent, or Firm*—Pretty, Schroeder & Poplawski

[57] ABSTRACT

A generic interface test adapter for connecting between a test station and a unit under test. The generic interface test adapter includes an interface frame and an interchangeable circuit card assembly that are configured to route the signals between test station and the unit under test. The interface frame includes an interface plane having a plurality of contact pins or spring-loaded probes, and the circuit card assembly has a plurality of contact pads, aligned to mated with the contact pins. The electrical connections between the test station and the unit under test can be reconfigured merely by changing the interchangeable circuit card assembly. A pressure frame is provided to securely hold the circuit card assembly against the interface plane to provide electrical connection. The pressure frame is pulled toward the interface frame by a cam and angled cam slot mechanism operated by a lever arm.

7 Claims, 9 Drawing Sheets

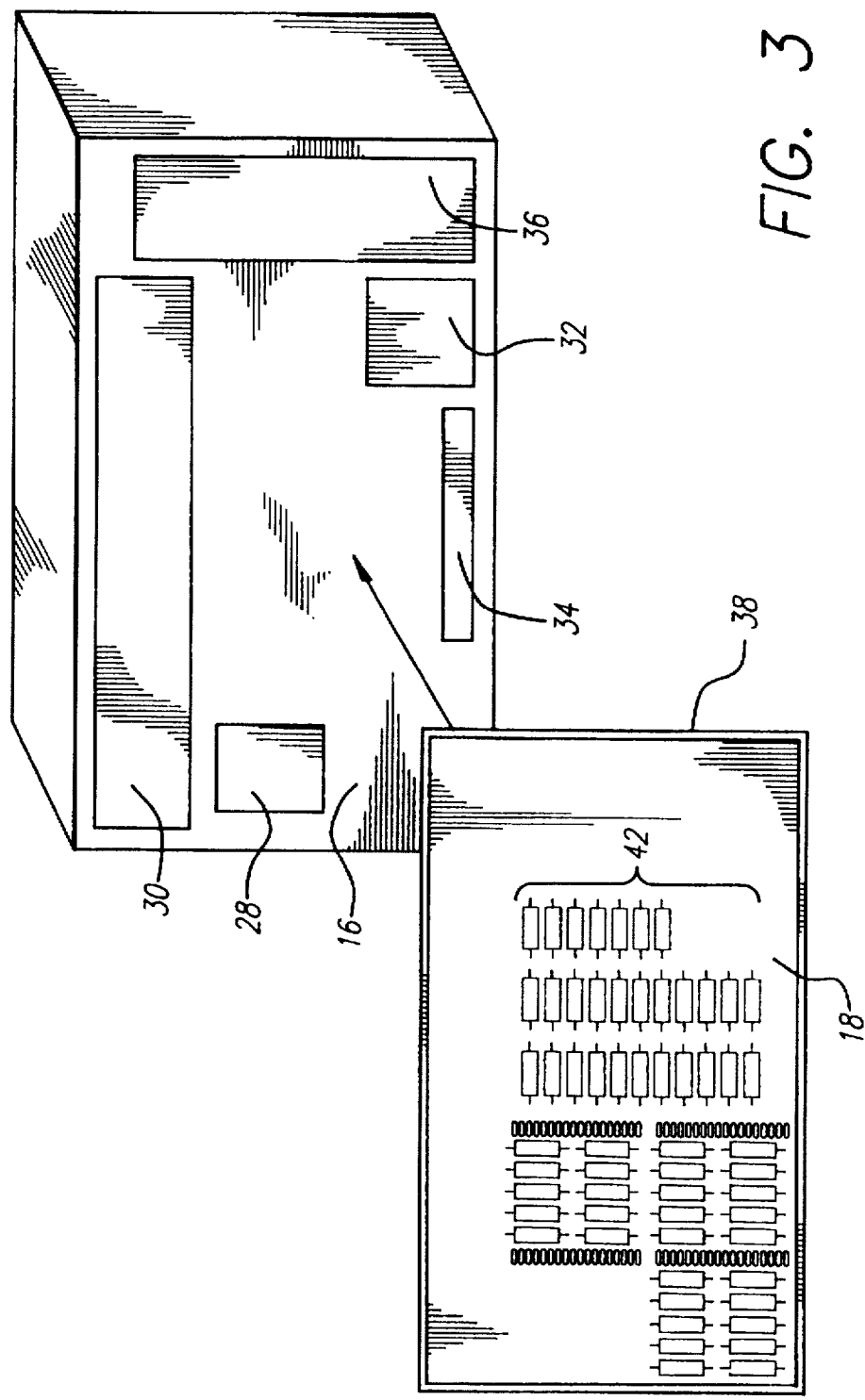

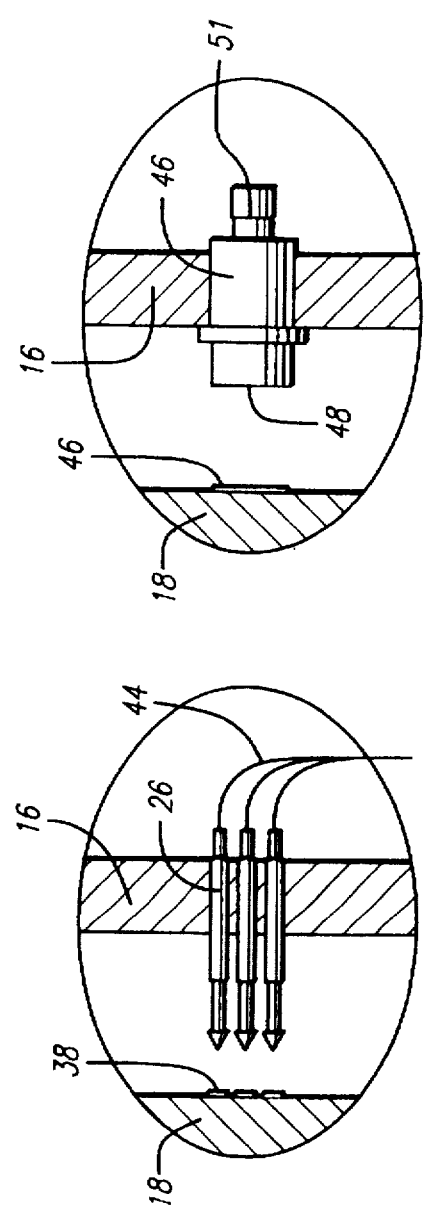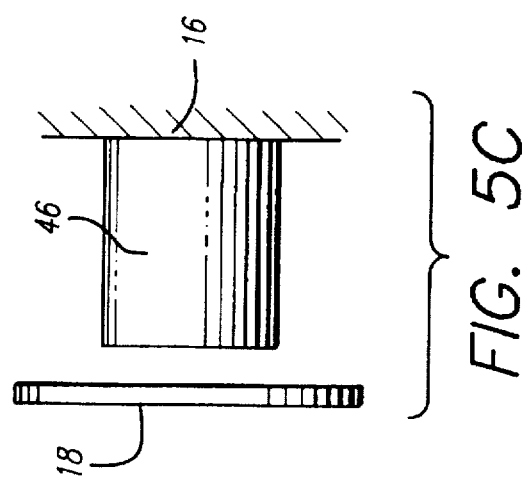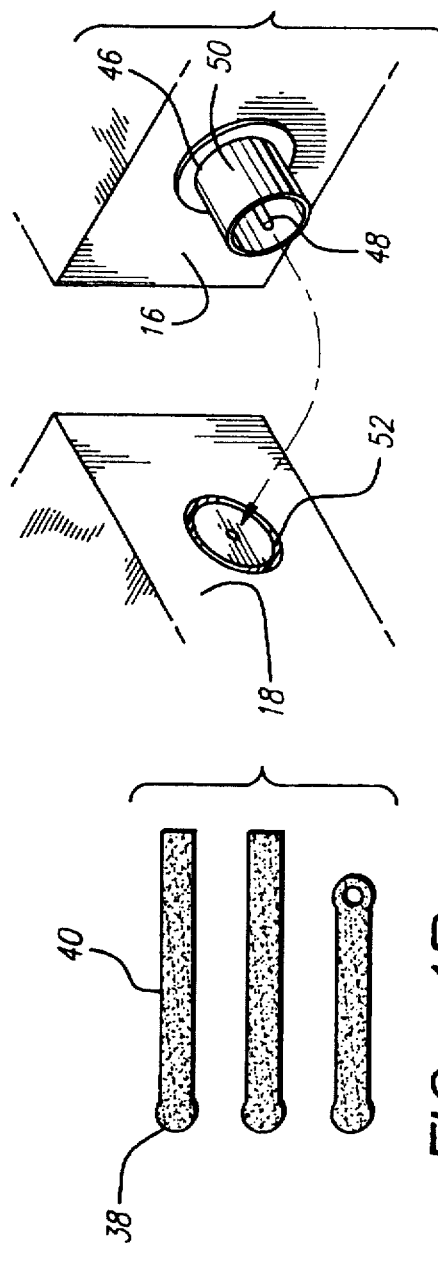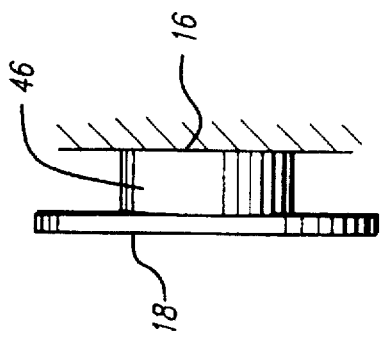

GENERIC INTERFACE TEST ADAPTER

BACKGROUND OF THE INVENTION

The present invention relates to interfacing a test station with a unit under test (UUT). More specifically, the invention relates to an interface test adapter having a standardized test interface for connecting a test station to any of a variety of UUTs.

A UUT is an electronic device that typically integrates into a larger electronic system such as, for example, an aircraft flight control system. UUTs are divided into categories based on their complexity and serviceability. A more complex UUT generally is referred to as a line replaceable unit (LRU). An LRU typically has its own housing and electrical connectors for providing as many as several hundred individual signal lines. A simpler UUT generally is referred to as a shop replaceable unit (SRU) and typically consists of a single circuit card. Accordingly, a UUT can have any of a variety of configurations and the test station must be flexible in order to test the different UUT configurations.

An example an interface test adapter for connecting the test station to any of a variety of UUTs is disclosed in U.S. Pat. No. 5,103,378 to Stowers et al. In the Stowers et al. patent, the test station has several computer controlled electronic instrumentation circuit cards housed in a modular card cage. The instrumentation cards are connected together through a mother board in the card cage. Electrical connectors are available on the front of each instrumentation card for any necessary connections to the UUT. An interconnect adapter is mounted on the front of the electronic instrumentation circuit cards to form a connector module that provides a defined interface between the test station and an interchangeable test adapter. A custom interchangeable test adapter is constructed for each differing UUT configuration. Each interchangeable test adapter has its own mechanical housing, circuit cards and internal wiring for mechanically and electrically connecting the connector module to the UUT. Typical interchangeable test adapters are shown in FIGS. 20–22 of the Stowers et al. patent.

As shown in FIG. 9, an interchangeable test adapter for an LRU-style UUT can be quite complex because no commonality exists from one test adapter to the next. Accordingly, individual wires run from point to point, often in bundles, between several connectors, circuit cards, and wire wrap boards. If a different LRU-style UUT is present for testing, a custom test adapter must be constructed for that specific UUT and significant effort must be expended in designing, constructing and wiring the new interchangeable test adapter. Further, as shown in FIG. 10, the interchangeable test adapter for an SRU-style UUT often is much different from the test adapter for an LRU-style UUT. Thus, the housing and wiring design used for constructing a test adapter for an LRU-style UUT is virtually useless in designing and constructing a test adapter for an SRU-style UUT. Not only is the design and construction of each custom test adapter expensive, but the test adapters are quite bulky, relatively difficult to handle and change, and require significant storage space when not in use.

Accordingly, there exists a need for an interface test adapter that is easily reconfigured to test any of a variety of UUTs and that is relatively easy to handle and to store when not in use. The present invention satisfies these needs and provides further related advantages.

SUMMARY OF THE INVENTION

The present invention is embodied in a generic interface test adapter for providing an interface between a test station and a unit under test. The generic interface test adapter includes an interface plane having a plurality of contact pins and a flat interface card having a plurality of contact pads. One portion of the contact pins is associated with predetermined electrical signals to or from the test station. The flat interface card has a flat surface configured to couple with the interface plane. The plurality of contact pads are on the flat surface. Each contact pad is associated with one of the contact pins on the interface plane such that, when the flat surface is brought into mating alignment with the interface plane, electrical contact is established between the plurality of contact pins and the associated contact pads. The test adapter also includes at least one connector for electrically coupling the interface card with the unit under test. Conductive traces on the interface card couple the connector with the contact pads.

In a more detailed feature of the present invention, the generic interface test adapter further includes an interface frame for housing the interface plane and a pressure frame that presses the interface card against the interface plane. The interface frame may also include a pair of card guides mounted on four telescopic guides protruding from the first frame at a direction perpendicular to, and at opposite ends of, the interface plane. The card guides assist in aligning the interface card with the interface plane. The interface frame may also include sliding cams and an actuator handle for actuating the sliding cams. Similarly, the pressure frame may include a cam follower plate having angled cam slots associated with the sliding cams. The sliding cams and the angled cam slots are configured such that, when the actuator handle is in an engaged position, the pressure frame presses the interface card against the interface plane with sufficient force to provide electrical contact between the plurality of contact pins and the associated plurality of contact pads.

In another more detailed feature of the present invention, the contact pins comprise spring-loaded metal probes. Further, the interface plane may include at least one rf style contact pin having an axial center conductor and a coaxial shield, and the circuit card assembly may include a concentric pair of contact pads for mating with the rf contact pin and an RF transmission line electrically coupled to the concentric pair of contact pads.

In another aspect of the present invention, the unit under test has one or more connectors and the interface frame also houses one or more interface connectors for receiving the connector from the unit under test. Further, the interface plane has a first plurality of contact pins associated with the test station and a second plurality of contact pins associated with the interface connector. Also, the interface plane is adapted to mate with the interface card or interchangeable circuit card assembly to electrically couple the test station to the interface connector.

In a more detailed feature of the present invention the circuit card assembly includes a first plurality of contact pads associated with the first plurality of contact pins and a second plurality of contact pads on the flat surface associated with the second plurality of contact pins. Further, the circuit card assembly includes conductive traces that couple select contact pads of the first plurality of contact pads with select contact pads of the second plurality of contact pads such that, when the flat surface is brought into mating alignment with the interface plane, electrical contact is established between the test station and the interface connector.

Other features and advantages of the present invention will become apparent from the following description of the preferred embodiment, taken in conjunction with the accompanying drawings, which illustrate by way of example the principles of the invention.

BRIEF DESCRIPTION OF THE DRAWINGS

The accompanying drawings illustrate the invention. In such drawings:

FIG. 3 is an exploded perspective view of the interface plane and the interchangeable circuit card assembly of FIG. 1.

FIG. 4A is an elevation view, partly in cross-section, of spring-loaded contact pins on the interface plane and corresponding contact pads on the circuit card assembly, of FIG. 3.

FIG. 4B is a plan view of contact pads and interconnect traces on the circuit card assembly of FIG. 3.

FIG. 5A is an elevation view, partly in cross-section, of a spring-loaded rf coaxial connector on the interface plane and a corresponding concentric contact pad on the circuit card assembly of FIG. 2.

FIG. 5B is a perspective view of the spring-loaded rf coaxial connector and a corresponding concentric contact pad of FIG. 5A.

FIG. 5C is a cross-sectional view of the spring-loaded rf coaxial connector of FIG. 5A, in its uncompressed state.

FIG. 5D is a cross-sectional view of the spring-loaded rf coaxial connector of FIG. 5A, with the coaxial connector pressed against the concentric contact pad with sufficient force to compress the spring.

DETAILED DESCRIPTION OF THE PREFERRED EMBODIMENTS

Figure 1:
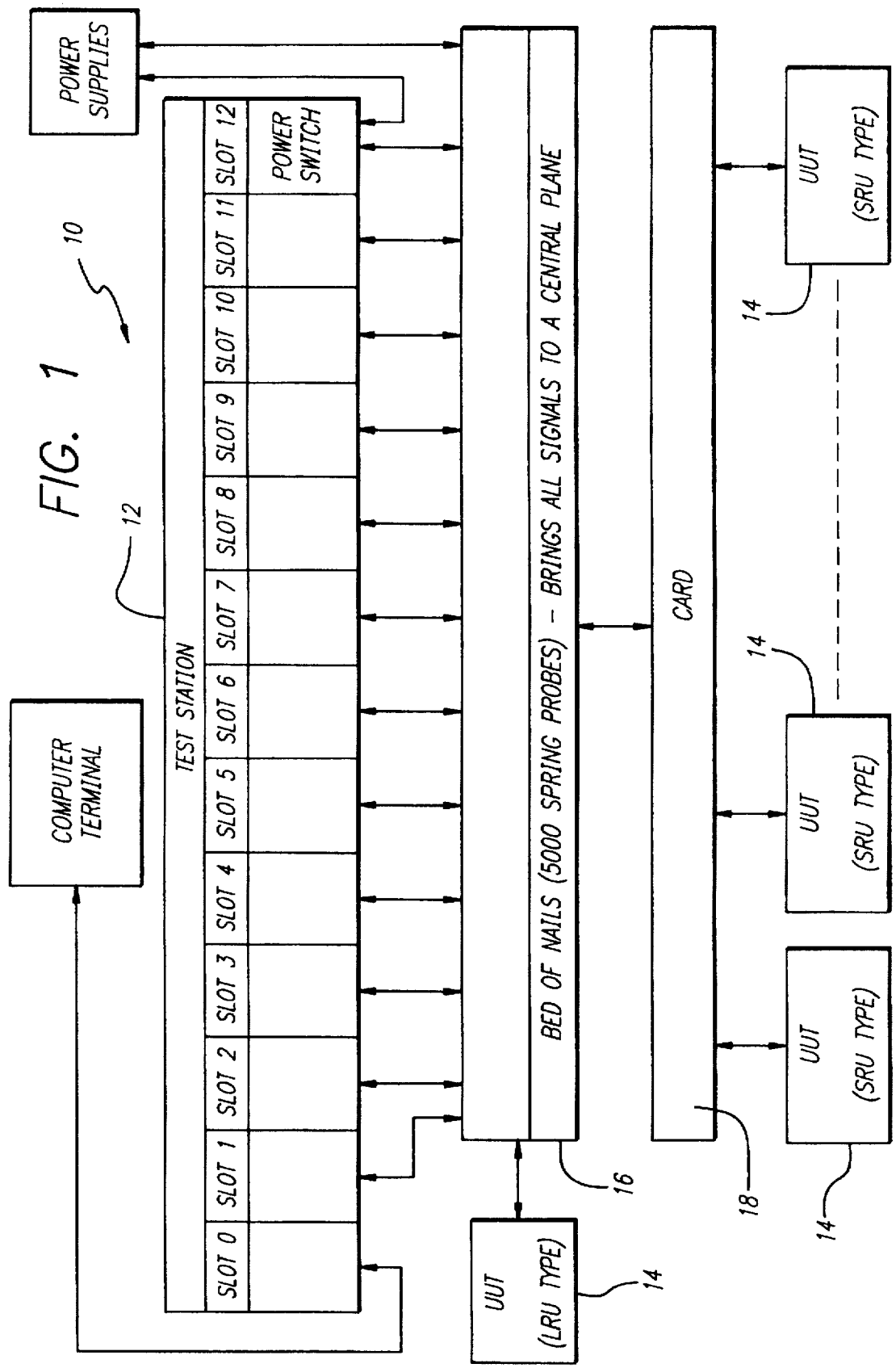
FIG. 1 is a block diagram of a generic interface test adapter of the present invention for providing an interface between a test station and a UUT.
Figure 2:
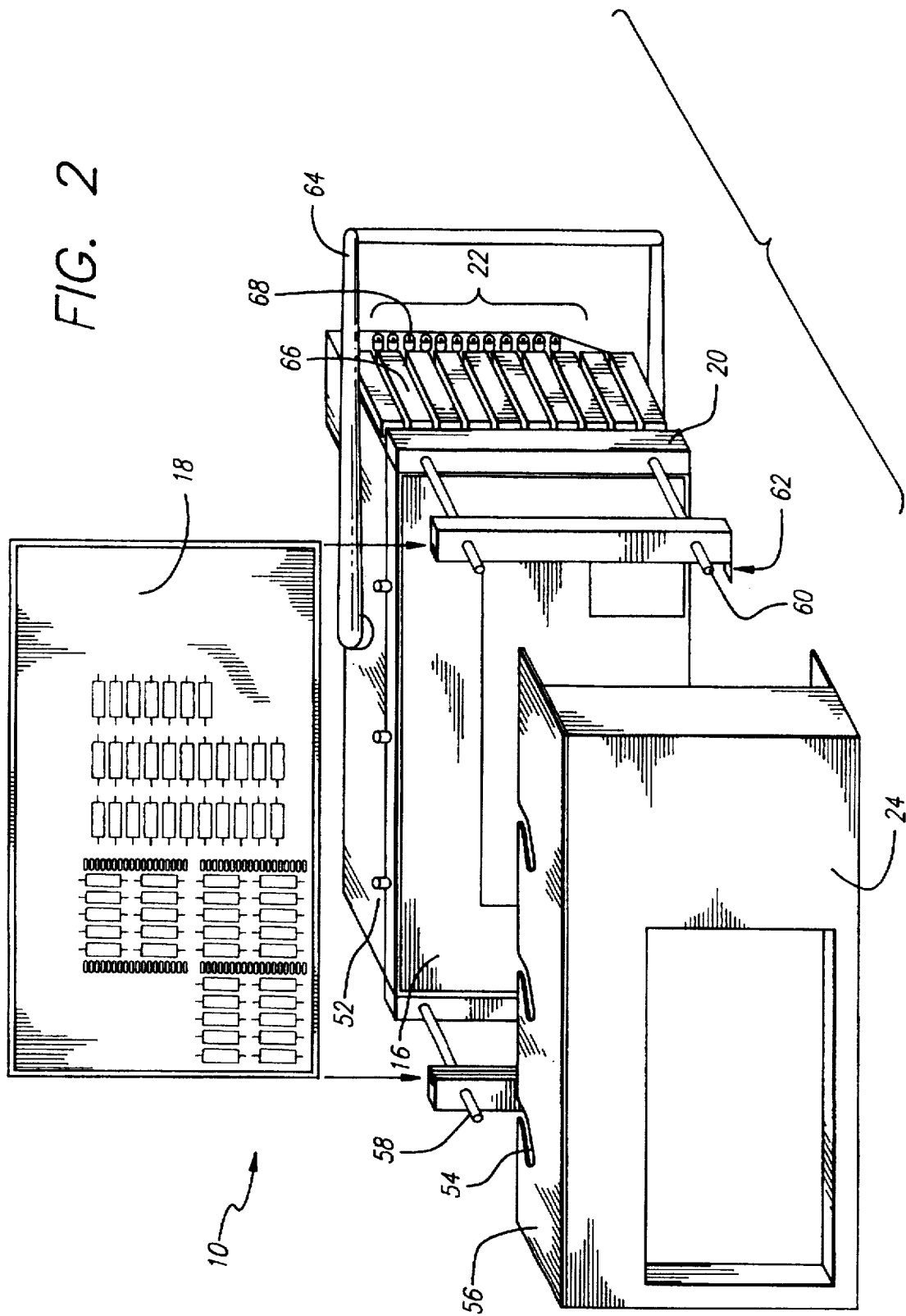
FIG. 2 is an exploded perspective view of a generic interface test adapter of the present invention having an interface plane, an interchangeable circuit card assembly, and a pressure frame for pressing the card assembly against the interface plane.

Referring now to the drawings, and particularly to FIGS. 1 and 2, the present invention is embodied in a generic interface test adapter, generally referred to by the reference numeral 10, for providing an electrical interface between a test station 12 and a unit under test (UUT) 14. Among the unique features of the generic interface test adapter are a permanently configured interface plane 16 and an interchangeable circuit card assembly 18 that allow the adapter to interface the test station with a variety of mechanically and electrically distinct UUT's merely by changing the interchangeable circuit card assembly. The generic interface test adapter further includes an interface frame 20 that houses the interface plane 16 and generic unit interface connectors 22, and includes a pressure frame 24 that holds the circuit card assembly against the interface plane.

As shown in FIGS. 3 through 5D, the interface plane 16 is a flat surface, having five different fields or regions of spring-loaded contact pins 26 or POGOS, often referred to as a bed of nails. Each contact pin generally is associated with a different electrical signal. The first and second fields, 28 and 30, correspond to the test station's instrumentation and test card signals, respectively, the third field 32 corresponds to the test station's high current signals, the fourth field 34 corresponds to the test station's rf signals, and the fifth field 36 corresponds to generic UUT interface connectors 22. The contact pins 26 in the first through fourth fields are electrically connected to the test station 12 and the contact pins in the fifth field are electrically connected to the generic UUT interface connectors. A sufficient number of contact pins are provided (approximately 5000) so that every electrical connection needed between the test station and the UUT 14 can made through the interface plane.

The interchangeable circuit card assembly 18 consists of a flat printed wire board or circuit card having five fields of contact pads 38 that correspond to the five contact pin fields of the interface plane 16. Each contact pad on the circuit card assembly is located to align and mate with a corresponding contact pin 26 on the interface plane. The circuit card further includes multilayered printed wires or conductive interconnect traces 40 for electrically connecting the contact pads. The circuit card also includes an open area having no contact pads to provide room for any UUT specific circuits 42 that may need to be provided to test a particular UUT 14.

The contact pins 26 and contact pads 38, when in firm mechanical contact, provide electrical connections between interface plane 16 and the circuit card assembly 18. For low frequency signals, the contact pins on the interface plane are spring-loaded probes or POGOS (FIG. 4A). A wire 44 connects to the rear of each contact pin. The corresponding contact pads on the circuit card assembly are round gold plated pads (FIG. 4B).

For rf signals, the contact pins are special coaxial spring-loaded probes 46 for interfacing with a signal from a 50 ohm coaxial cable. The rf probe has an axial center conductor 48 and a coaxial shield 50 that are spring-loaded and that provide electrical contact to the contact pad while maintaining the cable's impedance. An SMB connector 51 provided on the rear end of the rf probe. A suitable coaxial spring-loaded probe is available from TTI, Inc. of Woonsocket, Rhode Island. The corresponding rf contact pad 52 consists of concentric target pads. On the circuit card assembly 18, the rf signals are transmitted by stripeline that form rf transmission lines. Appropriate rf matching circuits are formed on the printed circuit board to match the impedance between the coaxial cable and corresponding stripeline on the printed circuit board. Because the circuit card assembly uses a multilayered printed circuit board, ground planes, guard traces, and other typical rf design structures can be employed to route the rf signals on the circuit card assembly. Further comparable signal delays can be maintained between signal lines because the wire or conductor lengths between the test station 12 and the UUT 14 are relatively defined and any differences can be accounted for by lengthening or shorting the applicable conductive traces 40 on the circuit card assembly.

The interface frame 20 (FIG. 2) also includes three sets of sliding cams 52 that engage three sets of angled slots 54 on a cam follower plate 56 included as part of the pressure frame 24. The cams slide parallel to the interface plane 16, and when engaged in the angled slots, provide a force that pulls the pressure frame toward the interface frame. The pressure frame has an opening 78, with a removable cover, for providing access to an area of the circuit card assembly.

To install the circuit card assembly 18 into the generic interface test adapter 10, the circuit card assembly is inserted into a pair of card guides 58 that are supported by four spring-loaded telescopic guides 60 that pull the card guides, and thus the circuit card assembly, against the interface plane 16. The circuit card assembly slides down the card guides until it reaches a predetermined position defined by stops 62 at the bottom of the guides. In this position, the contact pads 38 are aligned with corresponding contact pins 26. A cam actuator handle or lever 64 is connected to the cams and provides mechanical advantage for sliding the cams so that the circuit card assembly is pulled against the interface plane with sufficient pressure to compress the spring-loaded contact pins against the contact pads.

The generic UUT interface connectors 22 on the side of the interface frame 20 are zero insertion force connectors 66 and coaxial RF connectors 68. All of the electrical contacts in the generic DUT interface connectors have corresponding contact pins in the fifth contact pin field 36. Thus, each electrical contact in the UUT interface connectors can be individually connected to any contact pin in the fields 28, 30, 32 and 34, associated with the test station, by interconnecting the appropriate contact pads on the printed circuit card.

Figure 6:
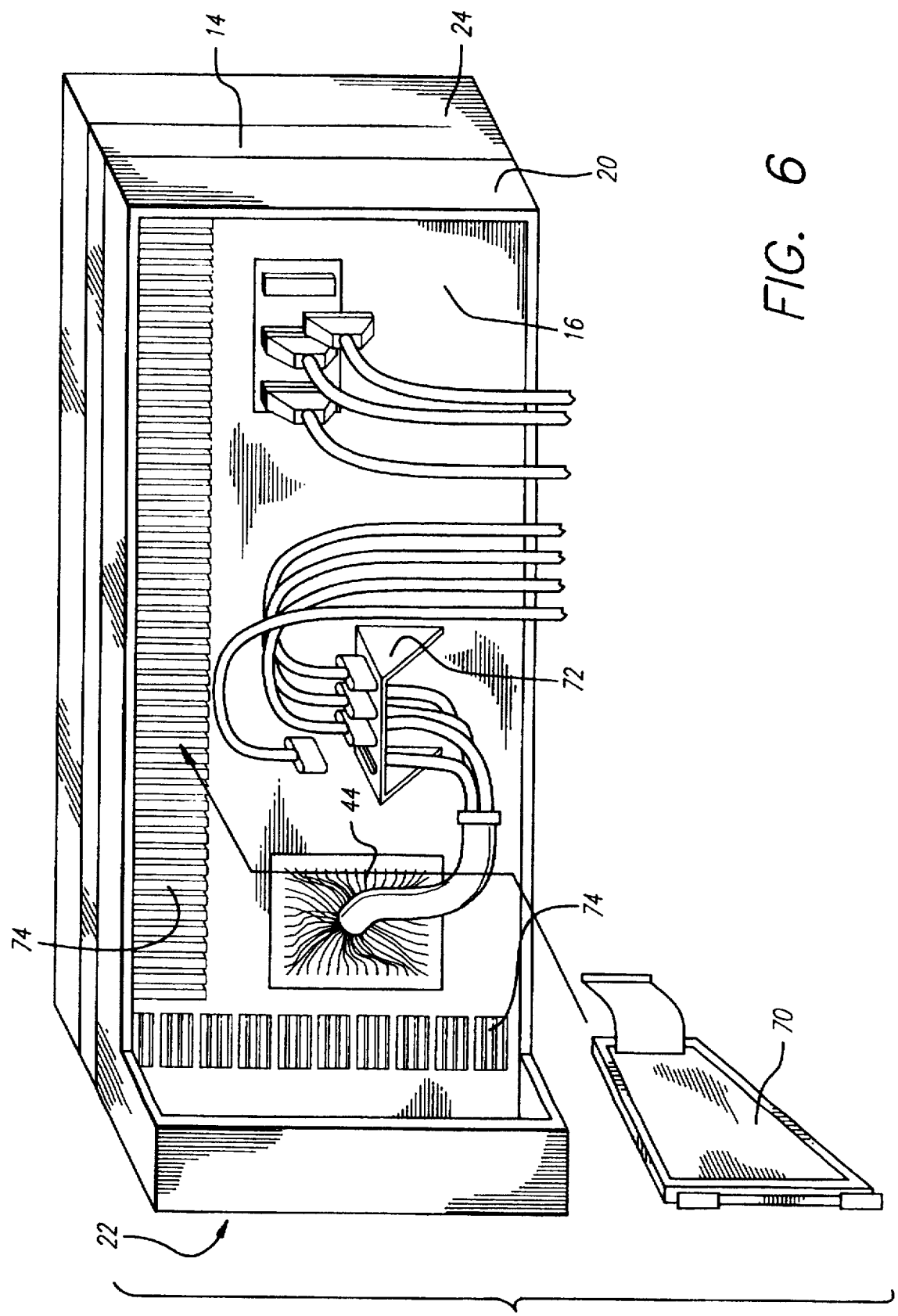
FIG. 6 is an exploded perspective rear view of the generic interface test adapter of FIG. 1.

As shown in FIG. 6, the electrical connection between the rear of the contact pins 26 and connector modules of the test station 12 can be made by ribbon cable assemblies 70. Alternatively, electrical connection to the rear of the contract pins can be made by providing a connector block 72 having wires 44 that connect the contact pins, or by providing connectors 74 directly on the rear of the interface plane 16. Because all electrical signals from the test station are available at the interface plane, there is no need to rewire the interface plane to test a distinct UUT. Instead, all necessary "rewiring" is preformed when the interchangeable circuit card assembly is designed for the particular UUT configuration. Existing computer assisted circuit board design and auto-routing tools can be used to design the circuit card assemblies and stored pre-existing designs for other UUT's can be modified taking advantage of the existing designs when designing new circuit card assemblies. Accordingly, the design and manufacture of the interchangeable circuit card assemblies of the present invention is much simpler and cost effective than the design and manufacture, using discrete wires, of existing test adapters.

Figure 7:
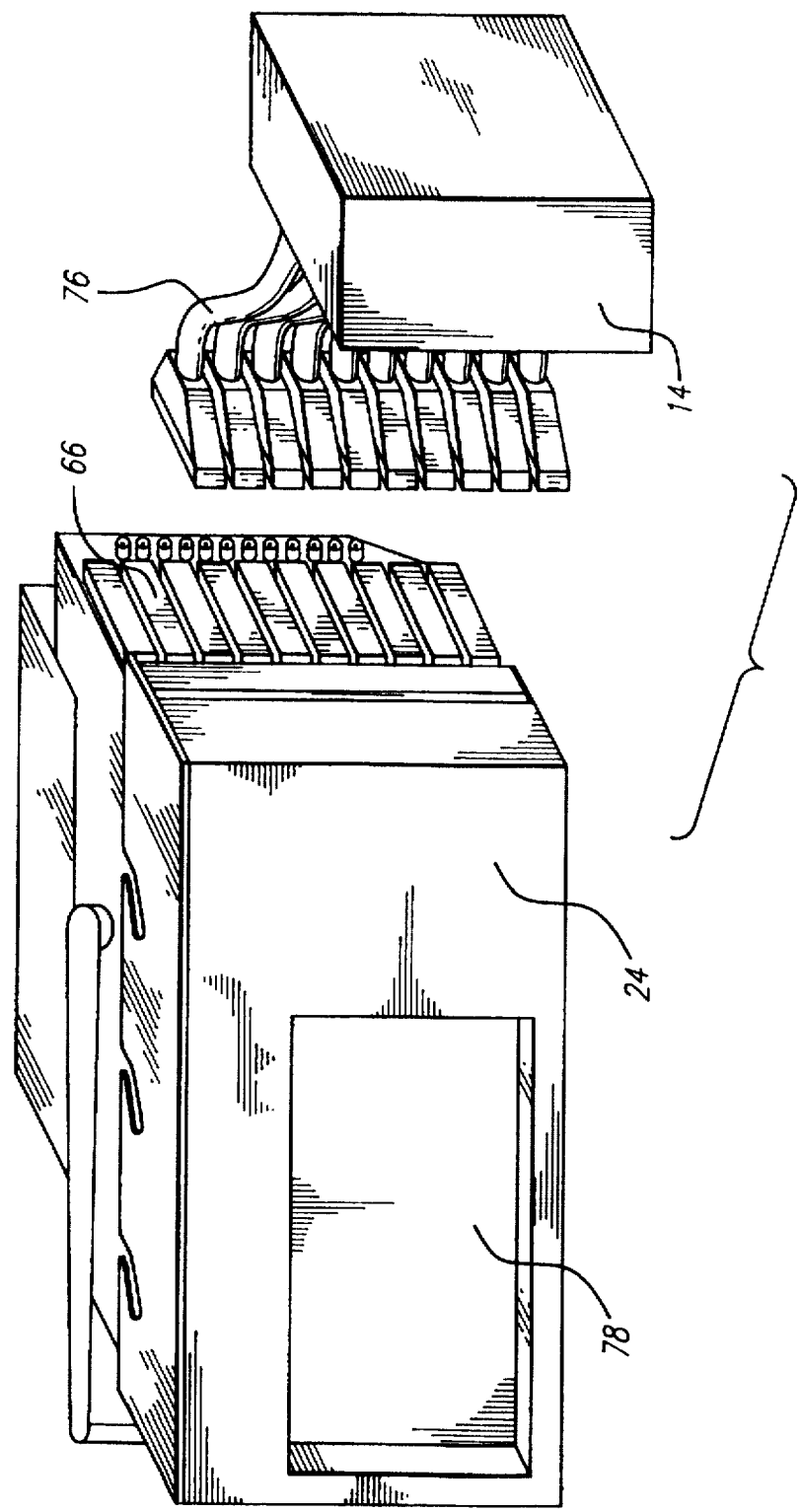
FIG. 7 is a perspective view of the generic interface tested adapter of the present invention configured for system level testing of a unit under test.

FIG. 7 shows a generic interface test adapter 10 configured to perform system level tests on an LRU-type UUT 14 through the zero insertion force connectors 66 of the generic UUT interface connectors 22 on the side of the interface frame 20. The UUT is connected to the connectors by test cables 76. All connections between the test station 12 and the generic UUT interface connectors are made through the interface plane 16 and the circuit card assembly 18.

Figure 8:
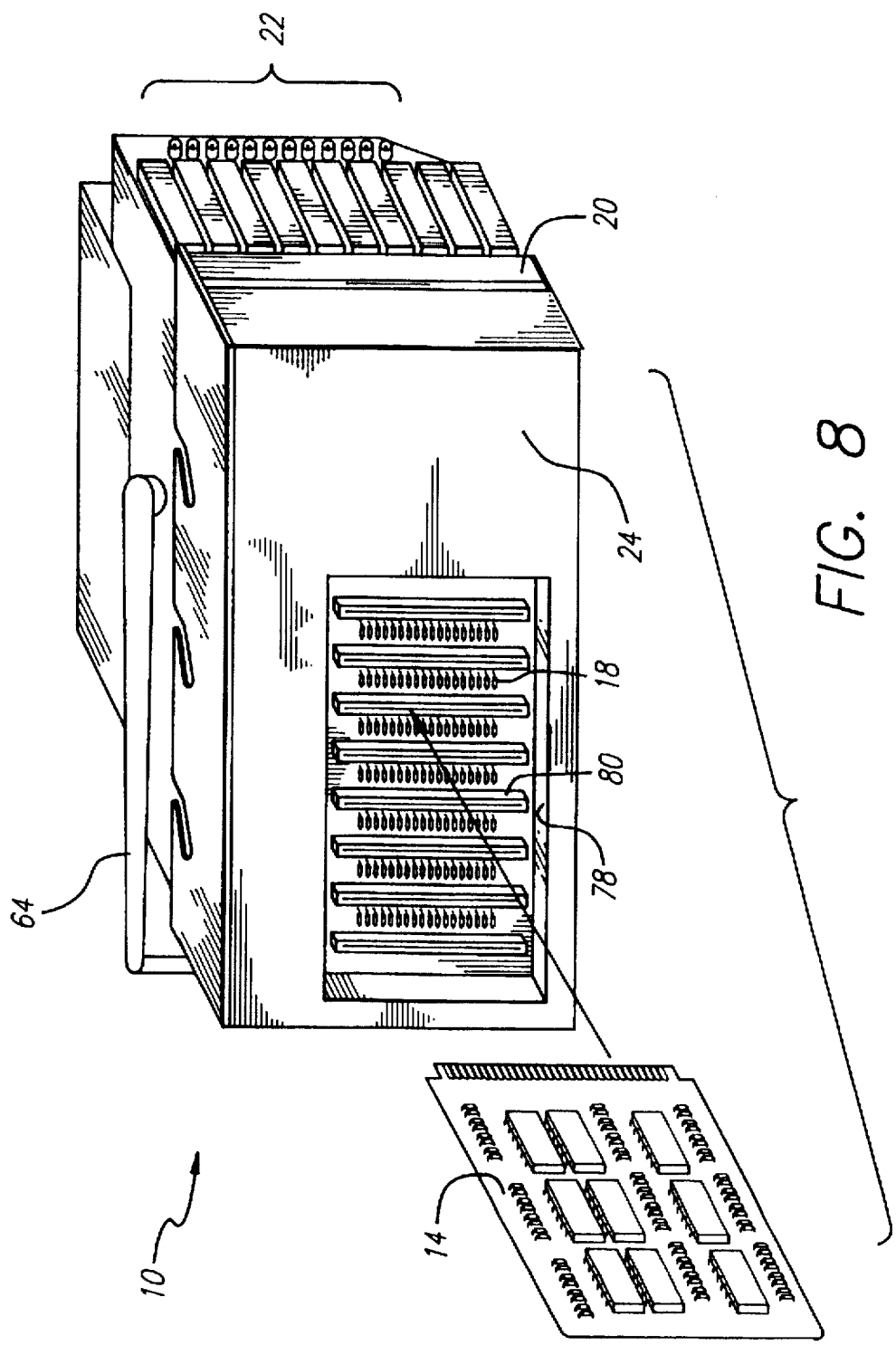
FIG. 8 is an exploded perspective view of a generic interface adapter of the present invention, configured for testing units at the card level.
Figure 9:
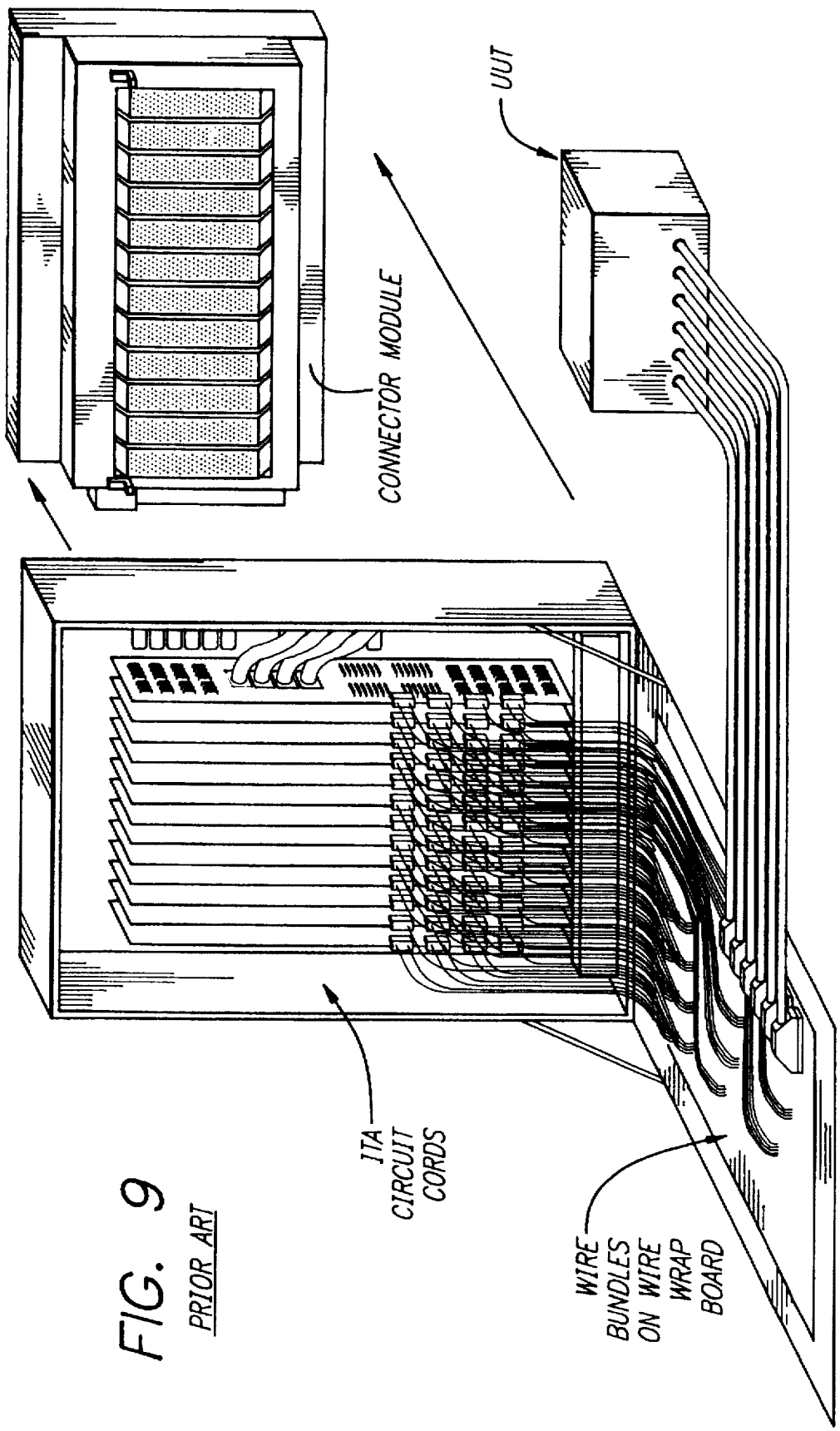
FIG. 9 is an exploded perspective view of an existing interchangeable test adapter for system level testing of a unit under test.
Figure 10:
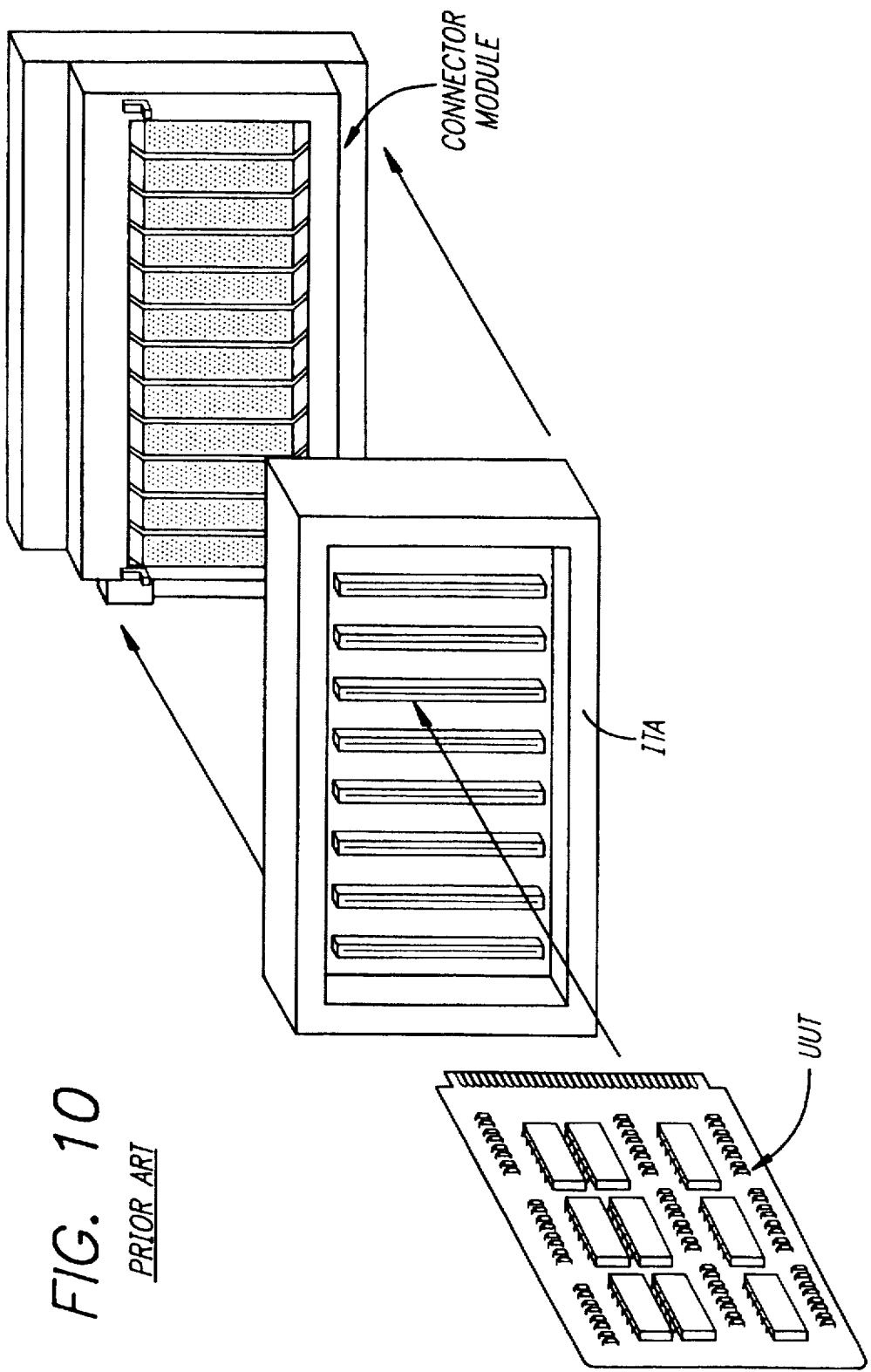
FIG. 10 is an exploded perspective view of another existing interchangeable test adapter for card-level testing of a unit under test.

As shown in FIG. 8, merely by changing the circuit card assembly 18 and removing the cover from the opening 78 in the pressure frame 24, the generic test adapter 10 can easily be reconfigured to test an SRU-type UUT or circuit card 14. The SRU-type circuit card is connected to the circuit card assembly by edge connectors 80 mounted on the surface of the circuit card assembly opposite the contact pad surface. Several SRU-type circuit cards can be simultaneously tested by using more than one edge connector and multiplexing circuitry, if needed.

Thus, the generic interface test adapter 10 allows a test station 12 to test any of a variety of UUTs 14 merely by changing the interchangeable circuit card assembly 18. Also, verification tests on the test station can be readily performed using a circuit card assembly configured to "loop back" the appropriate signals. Further, the handling and storage of the circuit card assemblies is much simpler than the handling and storage of the test adapters for existing systems.

Although the foregoing discloses the presently preferred embodiments of the present invention, it is understood that those skilled in the art may make various changes to the preferred embodiments shown without departing from the scope of the invention. The invention is defined only by the following claims.

We claim:

1. A generic interface test adaptor for configuring the coupling between a test station and a variety of line replaceable units and a variety of shop replaceable units under test, the generic interface test adaptor comprising:

a first connector for coupling a predetermined line replaceable unit with the generic interface test adaptor;

an interface plane having a first surface, a first field of contact pins, and a second field of contact pins, wherein a first end of the first field of contact pins and a first end of the second field of contact pins extend from the first surface, the second end of the first field of contact pins for coupling to the test station, and a second end of the second field of contact pins for coupling to the first connector;

an interface frame for housing the interface plane, the first connector attached to the interface frame;

a first interface card for configuring the generic interface test adaptor to test the predetermined line replaceable unit, the first interface card having, a second surface configured to couple with the first surface, a first field of contact pads and a second field of contact pads arranged on the second surface such that, when the second surface is brought into mating alignment with the first surface, electrical contact is established between the first end of the first field of contact pins and the first field of contact pads and between the first end of the second field of contact pins and the second field of contact pads, and a first set of conductive traces for coupling the first field of contact pads to the second field of contact pads, the first set of conductive traces arranged according to the predetermined line replaceable unit under test such that electrical coupling is made between the test station and the predetermined line replaceable unit; and a second interface card for configuring the generic interface test adaptor to test a predetermined shop replaceable unit, the second interface card having, a third surface configured to couple with the first surface, a fourth surface opposite the third surface, a third field of contact pads arranged on the third surface such that, when the third surface is brought into mating alignment with the first surface, electrical contact is established between the first end of the first field of contact pins and the third field of contact pads, and at least one second connector, arranged on the fourth surface, for coupling the predetermined shop replaceable unit with the generic interface test adaptor, and a second set of conductive traces for coupling the third field of contact pads to the at least one second connector, the second set of conductive traces configured according to the predetermined shop replaceable unit under test such that electrical coupling is made between the test station and the predetermined shop replaceable unit.

2. A generic interface test adapter as defined in claim 1, further comprising a pressure frame that presses the first interface card against the interface plane when the predetermined line replaceable unit is under test and presses the second interface card against the interface plane when the predetermined shop replaceable unit is under test.

3. A generic interface test adapter as defined in claim 2, wherein the interface frame further includes a pair of card guides mounted on telescopic guides protruding from the interface frame at a direction perpendicular to, and at opposite ends of, the interface plane, wherein the card guides align the first interface card and second interface card with the interface plane.

4. A generic interface test adapter as defined in claim 2, wherein:

the interface frame includes sliding cams and an actuator mechanism for actuating the sliding cams; and the pressure frame includes cam follower plates having angled cam slots associated with the sliding cams such that, when the actuator mechanism is in an engaged position, the pressure frame presses the either the first interface card or the second interface card, depending on whether the line replaceable unit or shop replaceable unit is under test, against the interface plane with sufficient force to provide electrical contact between the first end of the first field of contact pins and the first end of the second field of contact pins and the corresponding field of contact pads.

5. A generic interface test adapter as defined in claim 1, wherein the first field of contact pins and the second field of contact pins comprise spring-loaded metal probes.

6. A generic interface test adapter as defined in claim 1, wherein:

the interface plane includes at least one rf style contact pin having an axial center conductor and a coaxial shield; and the first interface card and the second interface card each have a concentric pair of contact pads associated with the rf contact pin and an rf transmission line electrically coupled to the concentric pair of contact pads.

7. A generic interface test adapter as defined in claim 2, wherein the first connector includes a plurality of electrical connectors attached to the interface frame.

* * * * *